United States Patent
Daoud

[19]

[11] Patent Number: 6,068,508

[45] Date of Patent: *May 30, 2000

[54] CONNECTOR ASSEMBLY TEST BLOCK

[75] Inventor: Bassel H. Daoud, Parsippany, N.J.

[73] Assignee: Lucent Technologies, Inc., Murray Hill, N.J.

[ * ] Notice: This patent issued on a continued prosecution application filed under 37 CFR 1.53(d), and is subject to the twenty year patent term provisions of 35 U.S.C. 154(a)(2).

[21] Appl. No.: 09/064,685

[22] Filed: Apr. 23, 1998

[51] Int. Cl.[7] .................................................. H01R 3/00
[52] U.S. Cl. ........................................... 439/490; 439/488
[58] Field of Search ..................................... 439/488, 489, 439/490, 491, 709; 379/399, 412, 27, 29, 22, 24, 25, 26

[56] References Cited

U.S. PATENT DOCUMENTS

| | | | |
|---|---|---|---|
| 4,113,340 | 9/1978 | Rapata | 439/490 |
| 4,396,809 | 8/1983 | Brunssen | 179/175.3 F |
| 4,585,290 | 4/1986 | Knickerbocker et al. | 339/97 R |
| 4,600,816 | 7/1986 | McDermott | 179/190 |
| 4,710,949 | 12/1987 | Ahuja | 379/26 |
| 5,324,211 | 6/1994 | Siemon et al. | 439/404 |
| 5,353,327 | 10/1994 | Adari et al. | 379/22 |
| 5,357,556 | 10/1994 | Dresser | 379/27 |
| 5,507,655 | 4/1996 | Goerlich | 439/108 |
| 5,556,301 | 9/1996 | Chishima et al. | 439/507 |
| 5,652,575 | 7/1997 | Pryor et al. | 340/825.77 |
| 5,721,773 | 2/1998 | Debalko | 379/412 |
| 5,724,421 | 3/1998 | Tuvy et al. | 379/39 |
| 5,755,822 | 5/1998 | Scheffner | 439/490 |

*Primary Examiner*—Paula Bradley
*Assistant Examiner*—Ross Gushi
*Attorney, Agent, or Firm*—Synnestvedt & Lechner LLP

[57] ABSTRACT

A connector assembly test block for simultaneously verifying the wiring of a plurality of pairs of electrically-conductive connectors in a connector assembly. The test block has a plurality of pairs of electrically-conductive contact members positioned for concurrent conductive contact with the pairs of connectors when the test block is interfaced with the connector assembly. The test block also includes an indicator device conductively connected to each pair of contact members. The indicator devices are responsive to a signal generated when energized. Each indicator device provides a perceptible indication verifying proper wiring of a pair of connectors when conductively connected to a pair of energized connectors.

19 Claims, 3 Drawing Sheets

CONNECTOR ASSEMBLY TEST BLOCK

FIELD OF THE INVENTION

This invention relates to a test block for testing a wiring installation. More particularly, while not limited thereto, this invention relates to a connector assembly test block for verifying proper wiring of connectors in a connector assembly of the type used in telecommunications applications for terminating telephone lines.

BACKGROUND AND THE PRIOR ART

The present invention is described initially in the context of telecommunications applications but, as described below, may also be used to verify proper wiring of connectors in other applications. In the context of telecommunications, it is frequently desirable to verify proper wiring of connectors in a connector assembly. Examples of widely accepted connector assemblies are shown in U.S. Pat. No. 3,957,335 to Troy, U.S. Pat. No. 5,127,845 to Ayer et al. and U.S. Pat. No. 5,575,680 to Suffi. A connector assembly typically comprises an electrically-insulative mounting block in which a plurality of electrically-conductive connectors are held in a standard predetermined spacial relationship. One-known example is a type-66 connector assembly.

The connectors may be used as connecting points, splice points or cross-connect points of a telecommunications network. In telecommunications applications, such connector assemblies are commonly mounted on a panel in a building entrance protector ("BEP") utility box which is in turn mounted in a building. The BEP serves as an interface between the telephone company's lines and the telephone service subscriber's lines.

During a typical installation of telecommunications service wiring in a building, a telecommunications wire bundle from a telephone company is brought into a splice chamber within a BEP. In the splice chamber, the wires are unbundled and electrically coupled to a surge protector field within the BEP. Wires leading from the surge protector are electrically coupled to the first ends of the connectors in a connector assembly. In telecommunications applications, the connectors are wired in pairs, each pair servicing one subscriber's telephone line. One of the pair is known in the art as the "tip" and the other is known as the "ring", the ring connector being connected to an electrical power source and the tip being used to carry a subscriber's voice signal back to the telephone company.

Wires leading from the building's telephone wiring infrastructure may then be electrically coupled to the second ends of the appropriate tip and ring connectors in the connector assembly to connect the individual subscriber's telephone lines with telephone company's telephone lines in the wire bundle.

The connector assembly has applicability in other applications such as in alarm systems in which a multiplicity of electrical conductors are to be electrically coupled.

Such connector assemblies are typically wired by forming either wire-wrap, insulation displacement connector ("IDC") or printed wiring board ("PWB") connections on a terminal portion of the connectors. Such connections are typically formed on terminals having either a wire-tail, IDC or pin terminal configuration, respectively. The formation of such connections is well-known in the art. Accordingly, the individual electrical connectors of the connector assembly may be constructed in a variety of terminal shapes, depending upon the connection method to be used. In telecommunications applications, connectors having a wire-tail terminal configuration and an IDC terminal configuration are common. However, in other applications, connectors having pin terminal configurations are used.

Before connecting the subscriber's telephone lines to the connectors in the connector assembly, the wiring of the connectors to the telephone company is tested to verify proper wiring. This was heretofore performed by a telephone company technician who caused the telephone company to energize the wires leading into the BEP. Using a test buzzer, the technician tested the pair of tip and ring connectors associated with each telephone line individually.

To test a particular telephone line, the technician contacted a pair of test probes leading from the test buzzer with the terminals on the second ends of the pair of connectors associated with that particular telephone line. If the connectors were properly wired, an audible buzz was discerned. Since each connector assembly typically serviced at least 50 to 100 telephone lines, each connector assembly typically included at least 50 to 100 pairs of connectors. Since a technician has heretofore been able to test only a single pair of connectors at any one time, this was a tedious and time-consuming portion of the installation process.

SUMMARY OF THE INVENTION

Accordingly, my invention satisfies the long-felt need for a connector assembly test block for simultaneously verifying the wiring of a plurality of pairs of electrically-conductive connectors in a connector assembly. This reduces installation time and costs.

The invention provides a connector assembly test block having a test block body. The test block body has an interfacing portion positionable in interfacing relationship with a connector assembly. The connector assembly test block includes a plurality of pairs of electrically-conductive contact members. Each of the pairs of contact members is positioned for concurrent conductive contact with one of the pairs of connectors in the connector assembly when the interfacing portion of the test block body is interfaced with the connector assembly. The connector assembly test block also includes a plurality of indicator devices. Each indicator device is responsive to a signal generated when energized. Each indicator device has a pair of conductive leads conductively connected to each pair of the plurality of pairs of contact members for providing a perceptible indication verifying proper wiring of a pair of connectors, when a pair of contact members is conductively connected to a pair of energized connectors.

BRIEF DESCRIPTION OF THE DRAWINGS

These and other features of the invention are delineated in detail in the following description and the accompanying drawings. In the drawings, illustrating a preferred embodiment of the invention.

DETAILED DESCRIPTION

Figure 1:
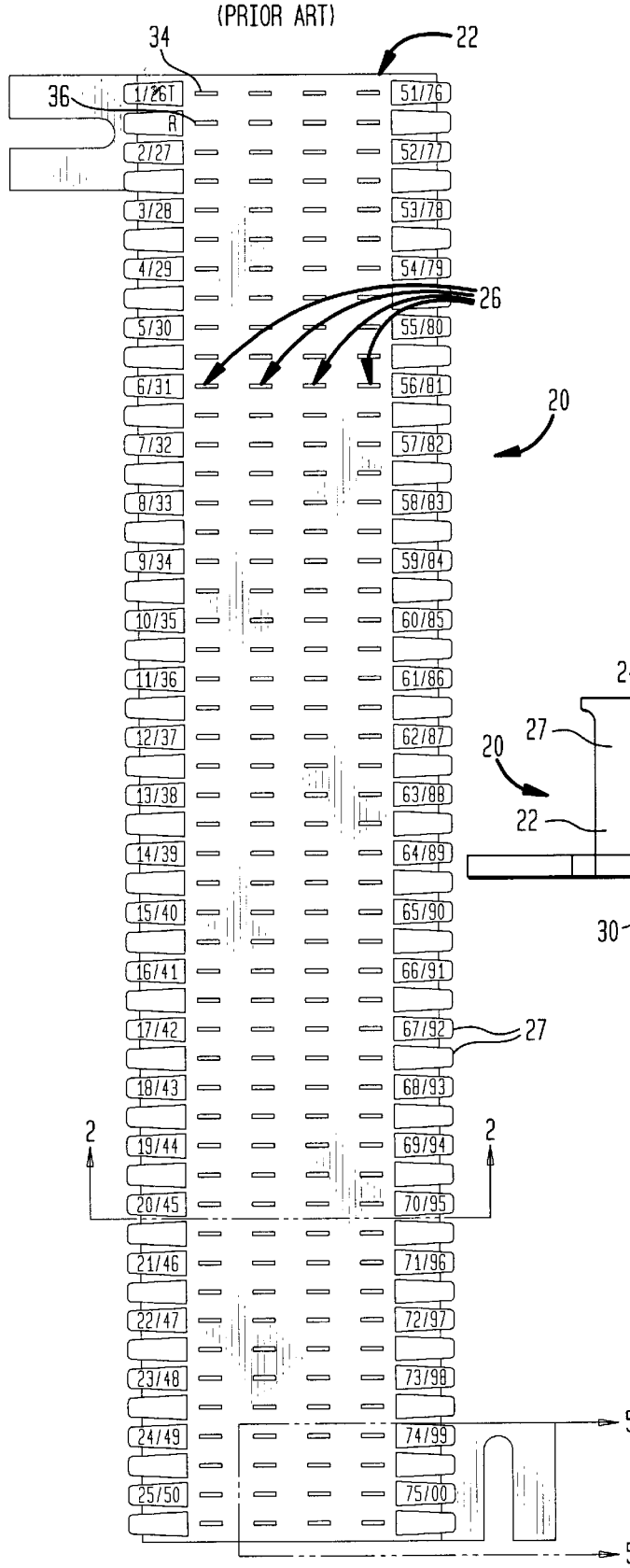
FIG. 1 is a top view of a connector assembly of the type heretofore known in the prior art.
Figure 2:
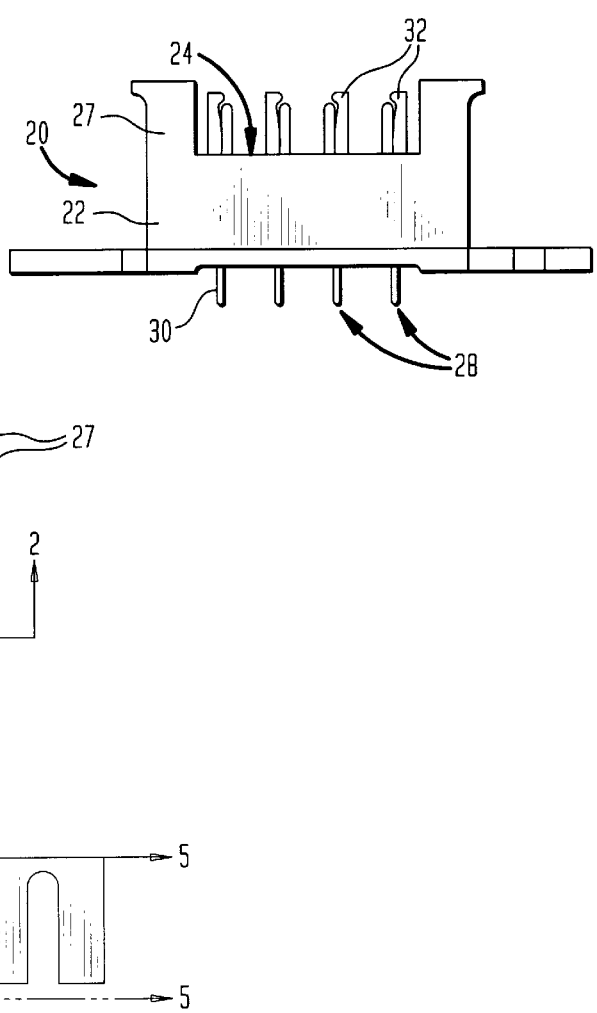
FIG. 2 is a cross-sectional view of the connector assembly taken on line 2—2 of FIG. 1, showing connectors having an insulation displacement connector terminal on one end and a wire-tail terminal on an opposite end, as heretofore known in the prior art.

FIGS. 1 and 2 illustrate a type-66 connector assembly 20 of a type presently in widespread use. The connector assembly 20 comprises an elongated mounting block 22 formed of an electrically-insulative material such as polycarbonate. The mounting block 22 has a planar surface portion 24 and a plurality of rows of openings 26 arranged in substantially parallel and spaced-apart groups as shown. The connector assembly also includes a multiplicity of wire retainers 27 extending in a pair of rows and projecting outwardly from the planar surface portion 24 of the connector assembly 20 on opposite sides of the projecting connectors 28. Spaces between the wire retainers 27 provide for segregation and guidance of the conductors to their respective connectors. The mounting block 22 can be found in different sizes and configurations depending on the desired use.

A plurality of electrically-conductive connectors 28 are supported in the plurality of openings 26 in the mounting block 22. The connectors 28 project through the planar surface portion 24 of the connector assembly 20. The connectors have a wire-tail terminal 30 on one end and an insulation displacement connector ("IDC") terminal 32 on the other end. Typically, all exposed ends of connectors 28 on the same side of the connector assembly 20 have the same terminal configuration. However, as shown in FIG. 2, the terminal configuration may not be the same on both sides of the connector assembly. Other type connectors (not shown) may have pin terminals on one or both sides, wire-tail terminals on both sides, etc.

Adjacent connectors are typically wired to the telephone company in tip and ring pairs. Each pair of tip and ring connectors services a single subscriber's telephone line. By way of example, connectors 34, 36 as shown in FIG. 1, could be wired as tip and ring connectors serving a single telephone line.

Figure 3:
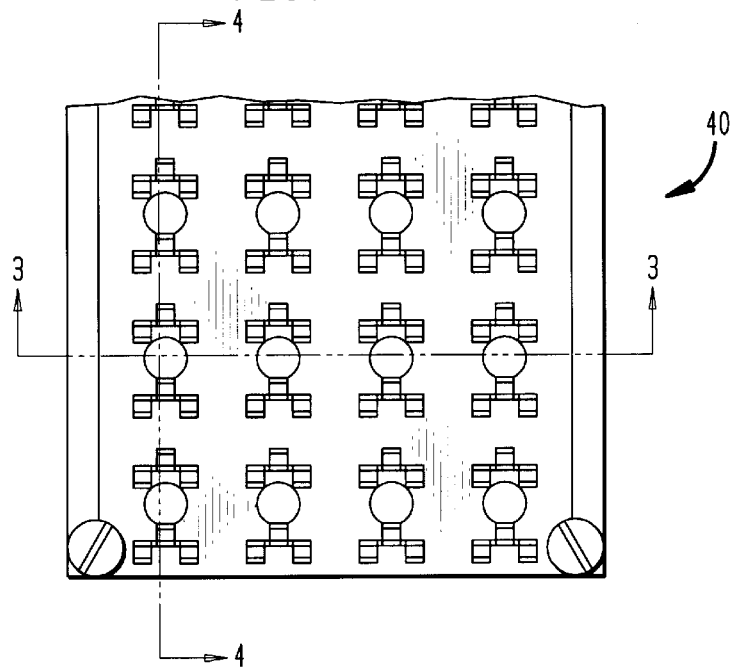
FIG. 3 is a plan view of a connector assembly test block in accordance with a preferred embodiment of the invention.
Figure 4:
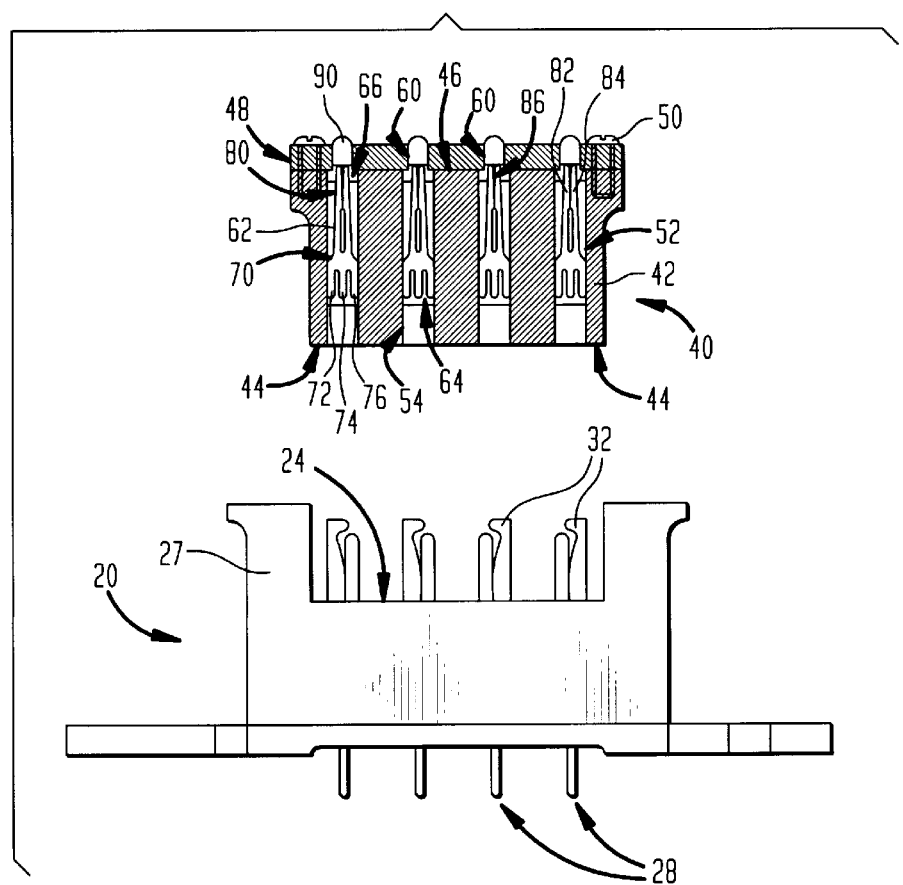
FIG. 4 is a cross-sectional view of the connector assembly as shown in FIG. 2 and a cross-sectional view of the connector assembly test block taken on line 3—3 of FIG. 2, showing the test block in position to be interfaced with the connector assembly.

Referring now to FIG. 3, a plan view of a preferred form of connector assembly test block 40 in accordance with the present invention is shown. As illustrated in FIG. 4, which is a sectional view also showing the connector assembly 20, the test block 40 allows for the simultaneous verification of the wiring of a plurality of pairs of electrical connectors 28. This is achieved by the provision of a test block body 42 having an interfacing portion which is preferably dimensioned to fit between the rows of wire retainers 27 in interfacing relationship with the planar surface portion 24 of the connector assembly 20. In the preferred embodiment, the test block body 42 is formed of a polycarbonate plastic material and its interfacing portion 44 is a planar surface, as shown in FIG. 4, for interfacing with the planar surface portion 24 of the connector assembly 20. As referred to herein, "interfaced" and interfacing relationship" shall denote either adjacent to but not in contact or in contiguous relationship.

Figure 5:
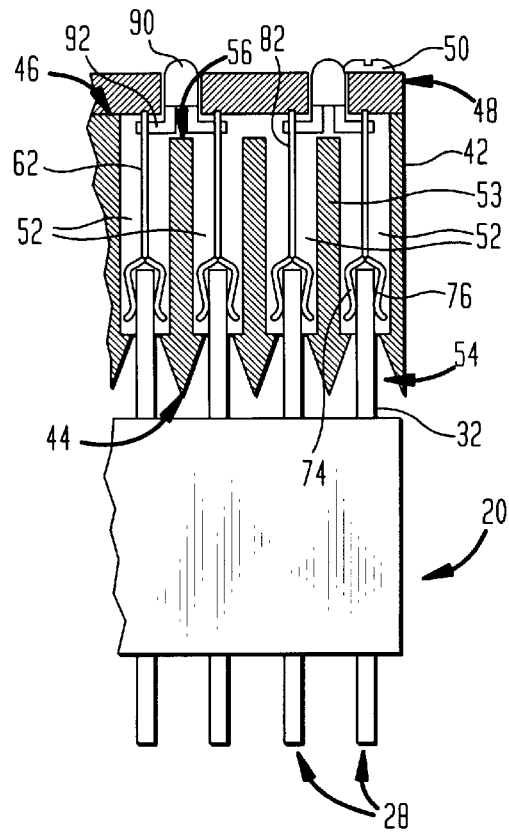
FIG. 5 is a cross-sectional view of the connector assembly taken on line 5—5 of FIG. 1 and the connector assembly test block taken on line 4—4 of FIG. 3, showing the connector assembly and the connector assembly test block in interfacing relationship with conductive engagement of the spring-clamps with the connectors.
Figure 6:
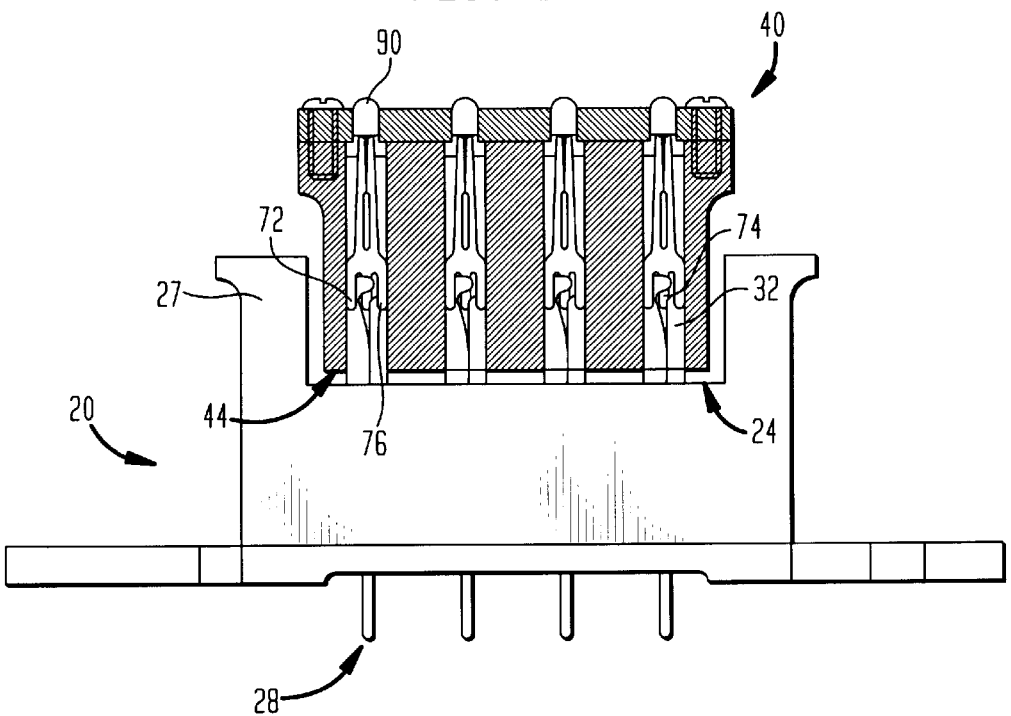
FIG. 6 is a cross-sectional view of the connector assembly and the connector assembly test block as shown in FIG. 4, showing the connector assembly and the connector assembly test block in interfacing relationship with conductive engagement of the spring clamps with the connectors.

Referring to FIGS. 4 and 5, the test block 40 has a plurality of openings 52 which extend through the interfacing planar surface portion 44 of the test block body 42. The openings are arranged in pairs (FIG. 5) extending through the interfacing planar surface portion 44 of the test block body 42 and are separated by partition portions 53 extending upwardly from the base of the test block body. Each partition portion 53 includes a multiplicity of support surfaces 56 for purposes explained below. The openings 52 are positioned to register with the pairs of connectors 28 in the connector assembly 20. Preferably, each opening is dimensioned to loosely and removably have a single contact member, as shown in FIGS. 5 and 6 explained below.

Referring now to FIG. 5, each opening 52 further defines an entrance portion 54 in the test block body 42. Each entrance portion 54 is positioned between the interfacing planar surface portion 44 of the test block body 42 and the contact members retained in the openings 52, as will be discussed more fully hereinafter. Each entrance portion 54 is dimensioned to receive a connector and has a cross-sectional area which is greatest at the interfacing planar surface portion 44 of the test block body 42. More specifically, each entrance portion 54 is preferably flared inwardly from the interfacing planar surface portion 44, as shown in FIG. 5, in order to guide a connector 28 inserted therethrough into conductive contact with a contact member when the test block body 42 is interfaced with the connector assembly 20. In addition, the flared configuration tends to straighten misaligned or bent connectors 28.

In the preferred embodiment, each opening 52 extends upwardly and exits through indicator device receiving openings 60 in a retaining plate 48 which is affixed to surface 46 of the test block body 42 by suitable fasteners 50. The retaining plate 48 caps the openings 52 and confines each contact member within an opening 52 of the test block body 42, as will be discussed further hereinafter. Other methods of joining the test block body and the retaining plate may be employed.

In the preferred embodiment, each of the indicator device receiving openings 60 preferably communicates with at least two openings 52 in the test block body 42 when the retaining plate is fastened in place, as shown in FIG. 5.

The indicator devices preferably rest with the indicator device receiving openings 60 in the retaining plate 48 and are supported on the support surfaces 56 which are spaced from the retaining plate 48, as seen in FIG. 5. When the retaining plate 48 is secured in place, the indicator devices are clamped on the support surfaces 56 with their conductive leads 92 extending over a pair of openings 52.

As explained above, the electrically-conductive contact members 62 are arranged in a plurality of pairs. The pairs are spaced to correspond with the spacial relationship of the pairs of electrical connectors 28 in the connector assembly 20 and are positioned for concurrent conductive contact with the pairs of connectors 28 when the interfacing planar surface portion 44 of the test block body 42 is interfaced with the surface portion 24 of the connector assembly 20.

Each contact member 62 has a spring-clamp 70 at its first end 64. The spring clamp 70 terminates in resilient fingers extending lengthwise of the contact member 62 for conductively engaging a connector 28 when the interfacing planar surface portion 44 of the test block body 42 is interfaced with the surface portion 24 of the connector assembly 20. While different spring-clamp configurations may be used, each spring-clamp 70 preferably includes three fingers 72, 74, 76, as shown in FIGS. 5 and 6. Two of the fingers 72, 76 are positioned to conductively engage a side of a connector 28 and one of the fingers 74 is configured to conductively engage an opposite side of the connector 28.

Referring to FIGS. 4–6, each contact member 62 has a pinch-type connector 80 at its second end 66 for conductively connecting to an indicator device. The pinch-type connector is preferably of the type generally known in the art as an "insulation displacement connector" and used to form conductive connections with insulated wires. Here, the pinch-type connector is contemplated for use with either insulated or uninsulated conductive leads of an indicator device. Each pinch-type connector has a pair of electrically-conductive tines 82, 84 extending in side-by-side relationship to one another. The tines 82, 84 are biased against separation from one another and define a slot 86 between them, as shown in FIG. 3, for conductively gripping and retaining a conductive lead of an indicator device. Such a pinch-type connector is advantageous because it allows for quick formation of electrical connections with indicator devices having a variety of conductive lead configurations.

As referred to above, each contact member 62 is housed in an opening 52 within the test block body 42. The contact members 62 are positioned within the openings 52 with the spring-clamps 70 positioned to register with the connectors 28, as shown in FIGS. 4–6. When the retaining plate 48 is secured to the test block body 42, it cooperates with the test block body 42 to retain and confine the contact members 62 within the openings 52. The retaining plate 48 receives and retains the indicator devices by clamping them between the support surfaces 56 of the partition portions 53 of the test block body 42 with its leads extending sideways into openings 52.

In the preferred embodiment, each indicator device is a light-emitting diode 90 having conductive leads 92. The conductive leads 92 of each light emitting diode 90 are conductively gripped and retained by the tines 82, 84 of the pinch-type connectors 80 of each pair of said plurality of pairs of contact members 62, as shown in FIGS. 5 and 6.

Each indicator device is responsive to a signal generated when the indicator device is energized. When a pair of contact members 62 is conductively connected to a pair of energized connectors 28, the indicator device provides a perceptible indication verifying proper wiring of the pair of connectors.

Each indicator device may provide any perceptible indication verifying proper wiring of the corresponding pair of connectors. An indicator device having a visual signal device is preferred because a technician may easily inspect a plurality of visual signal devices and verify the wiring of a plurality of pairs of connectors concurrently.

Although other signal devices may be suitable for some applications, in telecommunications applications, where the directional flow of electrical current is important, a directional visual signal device is advantageous. Use of a directional light-emitting diode 90 provides the advantage of indicating whether a pair of connectors is wired in the proper tip and ring configuration.

In use, the wiring of a plurality of connectors in a connector assembly may be simultaneously verified using the connector assembly test block 40 by first positioning the test block body 42 adjacent a connector assembly 20, such that the contact members 62 are facing the connectors 28 in the connector assembly 20, as shown in FIG. 3. The connector assembly test block 40 is then interfaced with the connector assembly 20 by pushing the connector assembly test block 40 onto the connectors 28 of the connector assembly 20 until the interfacing planar surface portion 44 of the connector assembly test block 40 and the planar surface portion 24 of the connector assembly are adjacent or contiguous. In doing so, the connectors 28 of the connector assembly 20 are guided through the interfacing planar surface portion 44 of the test block 40 and the entrance portions 54 of the openings 52 in the test block body 42. The connectors 28 are thereby guided into the fingers 72, 74, 76 of the spring-clamp 70 of each contact member 62, as shown in FIGS. 5 and 6. Each light-emitting diode 90 is thereby electrically connected to a pair of tip and ring connectors 28.

When a pair of properly wired tip and ring connectors is contacted with the spring-clamps 70 of a pair of contact members 62, the corresponding light-emitting diode 90 illuminates. Even if the wiring connections to the tip and ring connectors are secure, the light emitting diode will not light if the tip and ring connectors are not properly oriented relative to one another. In other words, the connector assembly test block will indicate improper wiring of pairs of connectors having their wiring reversed, as evidenced by an unlit light-emitting diode.

A technician using the connector assembly test block may visually scan the light-emitting diodes 90 of the test block 40 and determine if any pairs of connectors 28 are improperly wired, as indicated by an unlit light-emitting diode 90. In this manner, a plurality of pairs of connectors may be quickly and accurately tested to verify proper wiring thereof.

If the connector assembly 20 contains more connectors 28 than may be simultaneously tested by the connector assembly test block 40, the test block may be removed, repositioned adjacent untested connectors and tested in a similar manner until all connectors in the connector assembly have been so tested. The test block may then be removed, retained by the technician and reused to test other connector assemblies.

What is claimed is:

1. A connector assembly test block for verifying the wiring of a plurality of pairs of electrically-conductive connectors in a connector assembly for a plurality of telephone circuits wherein each pair of connectors is connected to a pair of lines of a single telephone circuit such that for each said pair of connectors, one connector of said pair of connectors is connected to one of said lines and the other connector of said pair is connected to the other of said lines, the test block comprising:

a test block body having an interfacing portion contoured to interface with the connector assembly;

a plurality of pairs of electrically-conductive contact members in the test block body, each of the pairs being positioned for concurrent conductive contact with one of the pairs of connectors when the interfacing portion of the test block body is interfaced with the connector assembly; and a plurality of indicator devices mounted on the test block body, there being an indicator device for each pair of contact members, each said indicator device for each said pair of contact members having a one lead conductively connected to one of said pair of contact members and another lead conductively connected to another of said pair of contact members such that each said indicator device is conductively connected across the pair of lines of one telephone circuit to provide a perceptible indication confirming proper wiring at the test block when the connector assembly test block is interfaced with the connector assembly.

2. The test block of claim 1 wherein the interfacing portion of the test block body is a planar surface.

3. The test block of claim 2 wherein the connector assembly comprises a planar surface portion through which the connectors project, and wherein the connector assembly further comprises wire retainers extending in a pair of rows and projecting outwardly from the planar surface portion of the connector assembly on opposite sides of the projecting connectors, wherein the interfacing planar surface portion of the test block body is dimensioned to fit between the rows of wire retainers in interfacing relationship with the planar surface portion of the connector assembly.

4. The test block of claim 3 wherein a first end of each contact member comprises a spring-clamp terminating in resilient fingers extending lengthwise of the contact member for conductively engaging a connector when the surfaces are in interfacing relationship.

5. The test block of claim 4 wherein said resilient fingers comprise a pair of opposed fingers extending lengthwise of the contact member and disposed for conductively engaging opposite sides of a connector.

6. The test block of claim 4 wherein each spring-clamp comprises three resilient fingers, two of the fingers being disposed for conductively engaging a side of a connector, and one of the fingers being disposed for conductively engaging an opposite side of the connector.

7. The test block of claim 6 wherein a second end of each contact member comprises a pinch-type connector having a pair of electrically-conductive tines extending in side-by-side relationship to one another, the pair of tines being biased against separation from one another and defining a slot for conductively gripping and retaining a conductive lead of an indicator device positioned therebetween.

8. The test block of claim 7 further comprising a plurality of openings arranged in pairs and extending through the interfacing planar surface portion of the test block body, the openings of the pairs of openings being separated by a partition portion of the test block body, the contact members being housed within the openings with the spring-clamps positioned to register with the pairs of connectors.

9. The test block of claim 8 wherein each opening further defines an entrance portion intermediate the interfacing planar surface portion of the test block body and the spring-clamps of the contact members, the entrance portion being dimensioned to receive at least one connector and having a cross-sectional area which is greatest at the interfacing planar surface portion of the test block body.

10. The test block of claim 9 wherein each entrance portion is flared inwardly from the interfacing planar surface portion for guiding a connector inserted therethrough into a spring-clamp of a contact member when the test block body is interfaced with the connector assembly.

11. The test block of claim 10 wherein each opening extends through a side of the test block body opposite the interfacing planar surface portion, and wherein the connector assembly test block further comprises a retaining plate secured to the test block body on the side opposite the interfacing planar surface portion for capping the openings and confining each contact member within an opening of the test block body.

12. The test block of claim 11 further comprising means for releasably securing the retaining plate to the test block body.

13. The test block of claim 12 wherein the retaining plate has a plurality of indicator device receiving openings dimensioned to receive and retain the indicator devices, the indicator devices being retained in the indicator device receiving openings when the retaining plate is secured to the test block body.

14. The test block of claim 13 wherein each indicator device receiving opening in the retaining plate communicates with at least two openings in the test block body when the retaining plate is secured to the test block body.

15. The test block of claim 14 wherein each partition portion includes an indicator device support surface spaced from the retainer plate, the indicator devices being clamped between the indicator device support surfaces and the retaining plate when the retaining plate is secured to the test block body.

16. The test block of claim 15 wherein the pairs of openings in the test block body are separated by a partition portion which includes a support surface spaced from the retainer plate.

17. The test block of claim 16 wherein each indicator device comprises a visual signal device for providing a visual indication verifying proper wiring of a pair of connectors.

18. The test block of claim 17 wherein each visual signal device comprises a light-emitting diode.

19. A test block for concurrently testing multiple pairs of electrically-conductive connectors in a connector assembly for multiple telephone circuits, wherein each pair of connectors is connected to a respective telephone circuit such that each connector of each pair of connectors is connected to a respective line of a respective telephone circuit, the test block comprising:

a body contoured to interface with the connector assembly;

multiple pairs of electrically-conductive contact members, the pairs of contact members being positioned on the body for concurrent contact with respective pairs of connectors in the connector assembly when the body is interfaced therewith; and multiple indicator devices mounted on the body, there being at least one of said multiple indicator devices for and conductively connected across each of said multiple pairs of electrically-conductive contact members, each of said indicator devices providing a perceptible indication at the test block to confirm proper wiring of the connectors.

* * * * *